(12) United States Patent
Chen et al.

(10) Patent No.: US 11,693,295 B2
(45) Date of Patent: Jul. 4, 2023

(54) AUTO-FOCUSING DEVICE AND METHOD OF FABRICATING THE SAME

(71) Applicant: TAIWAN SEMICONDUCTOR MANUFACTURING CO., LTD., Hsinchu (TW)

(72) Inventors: Ting-Jung Chen, Kaohsiung (TW); Shih-Wei Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 424 days.

(21) Appl. No.: 16/850,867

(22) Filed: Apr. 16, 2020

(65) Prior Publication Data

US 2020/0409238 A1    Dec. 31, 2020

Related U.S. Application Data

(60) Provisional application No. 62/868,571, filed on Jun. 28, 2019.

(51) Int. Cl.
*G03B 13/36* (2021.01)
*G02B 7/09* (2021.01)
(Continued)

(52) U.S. Cl.
CPC ............... *G03B 13/36* (2013.01); *G02B 7/09* (2013.01); *H04N 23/67* (2023.01); *H10N 30/03* (2023.02); *H10N 30/07* (2023.02); *B81B 2201/03* (2013.01); *G03B 2205/0053* (2013.01); *H10N 30/01* (2023.02)

(58) Field of Classification Search
CPC ........ H04N 23/67; H10N 30/01; H10N 30/03; H10N 30/07; B81B 2201/03; G02B 7/09; G03B 13/36; G03B 2205/0053
See application file for complete search history.

(56) References Cited

U.S. PATENT DOCUMENTS 6,812,820 B1 * 11/2004 Fouillet ................ H01H 1/0036
337/333
9,128,343 B2 * 9/2015 Blackburn .............. G02F 1/153
(Continued)

FOREIGN PATENT DOCUMENTS

CN      203054328 U    7/2013
CN      106604887 A    4/2017
(Continued)

*Primary Examiner* — Jeffrey T Carley
(74) *Attorney, Agent, or Firm* — Maschoff Brennan

(57) ABSTRACT

In accordance with some embodiments, a method of forming an auto-focusing device is provided. The method includes forming a cantilever beam member. The cantilever beam member has a ring shape. The method further includes forming a piezoelectric member over the cantilever beam member. The method also includes forming a membrane over the cantilever beam member. The membrane has a first region and a second region. The first region has a planar surface, and the second region is located between the first region and an inner edge of the cantilever beam member and has a plurality of corrugation structures. In addition, the method includes applying a liquid optical medium over the membrane and sealing the liquid optical medium with a protection layer.

20 Claims, 9 Drawing Sheets

(51) Int. Cl.
*H04N 23/67* (2023.01)
*H10N 30/03* (2023.01)
*H10N 30/07* (2023.01)
*H10N 30/01* (2023.01)

(56) References Cited

U.S. PATENT DOCUMENTS

| | | | | |
|---|---|---|---|---|
| 10,001,629 | B2 * | 6/2018 | Craen | G02B 3/0081 |
| 10,393,991 | B2 * | 8/2019 | Ko | H02N 1/006 |
| 2004/0125472 | A1 * | 7/2004 | Belt | G02B 26/0858 |
| | | | | 359/849 |
| 2006/0165917 | A1 * | 7/2006 | Hiruma | G02F 1/133711 |
| | | | | 428/1.2 |
| 2010/0208357 | A1 * | 8/2010 | Batchko | G02B 5/20 |
| | | | | 359/666 |
| 2012/0105952 | A1 * | 5/2012 | Takai | G02B 30/28 |
| | | | | 359/462 |
| 2012/0170920 | A1 * | 7/2012 | Moreau | G02B 3/14 |
| | | | | 359/666 |
| 2018/0179054 | A1 | 6/2018 | Chang et al. | |
| 2019/0039880 | A1 * | 2/2019 | Paci | B81B 3/0024 |

FOREIGN PATENT DOCUMENTS

| | | | | |
|---|---|---|---|---|
| CN | 114270241 A | * | 4/2022 | B29D 11/00807 |
| EP | 2535310 A2 | * | 12/2012 | B81B 3/001 |
| JP | 2013068875 A | * | 4/2013 | |
| TW | M380334 U | | 5/2010 | |
| WO | WO-2011032925 A1 | * | 3/2011 | G02B 26/0825 |
| WO | 2013/05227 A1 | | 4/2013 | |
| WO | WO-2016007250 A1 | * | 1/2016 | B06B 1/0622 |

\* cited by examiner

AUTO-FOCUSING DEVICE AND METHOD OF FABRICATING THE SAME

PRIORITY CLAIM AND CROSS-REFERENCE

This application claims priority to U.S. Provisional Application Ser. No. 62/868,571, filed Jun. 28, 2019, which is herein incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

Concurrent with advances in functional density, developments in micro-electromechanical systems (MEMS) devices have led to entirely new devices and structures at sizes far below what was previously attainable. MEMS devices are the technology of forming micro-structures with mechanical and electronic features. The MEMS device may comprise a plurality of elements (e.g., movable elements) for achieving mechanical functionality. In addition, the MEMS device may comprise a variety of sensors that sense various mechanical signals such as pressure, inertial forces and the like, and convert the mechanical signals into their corresponding electrical signals.

MEMS applications include motion sensors, pressure sensors, printer nozzles and the like. Other MEMS applications include inertial sensors such as accelerometers for measuring linear acceleration and gyroscopes for measuring angular velocity. Moreover, MEMS applications may extend to optical applications such as imaging module, and radio frequency (RF) applications such as RF switches and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
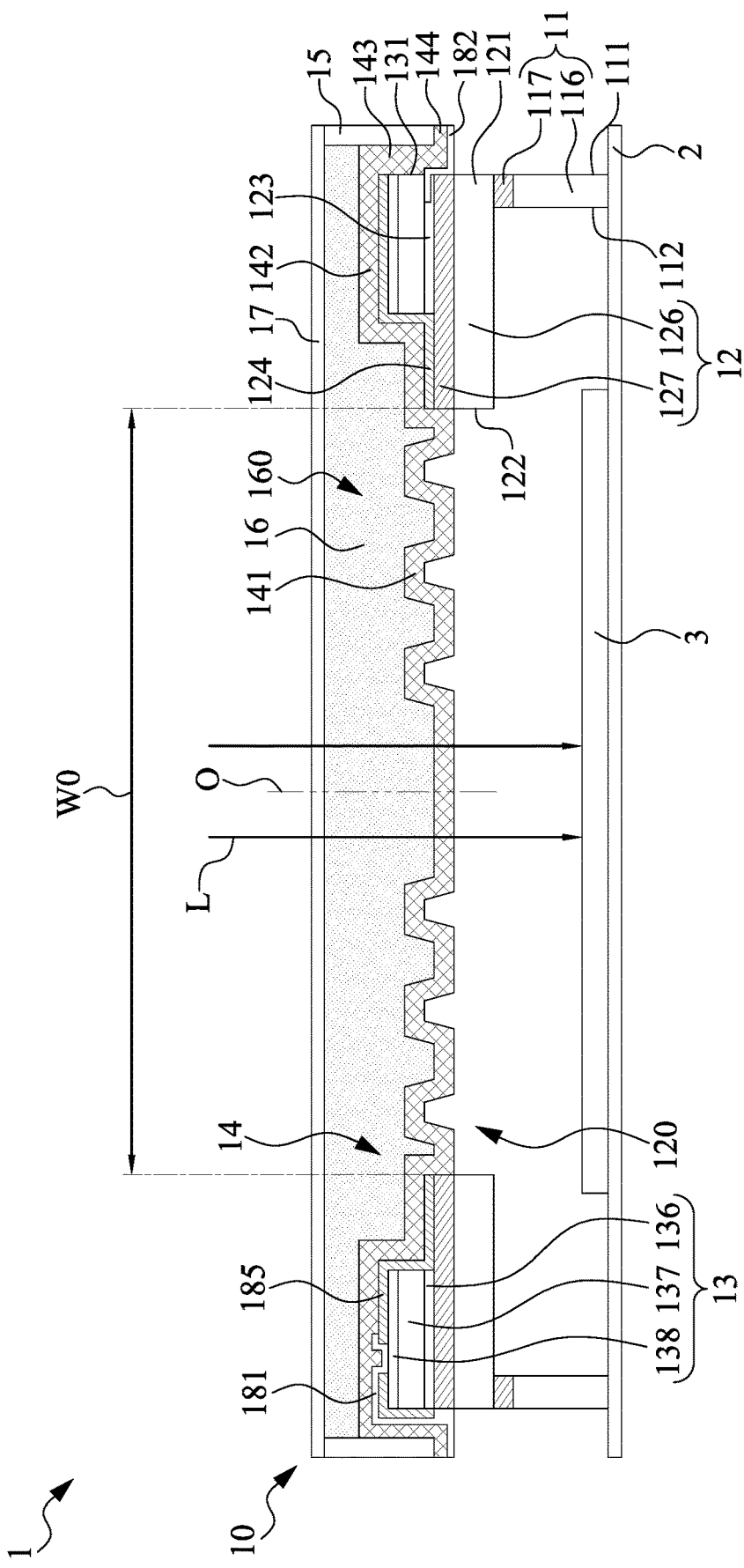
FIG. 1 is a cross-sectional view of an imaging device, in which a membrane for controlling focal point is in a planar state, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first projection over or on a second projection in the description that follows may include embodiments in which the first and second projections are formed in direct contact, and may also include embodiments in which additional features may be formed between the first and second projections, such that the first and second projections may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One application of microelectromechanical systems (MEMS) devices is an auto-focusing device of an imaging module. In the auto-focusing device, a membrane is positioned on an optical axis of the imaging module. By changing a curvature of the membrane, a focal point of a light impinged into the imaging module is adjusted so as to produce correctly focused image. However, due to uneven stress distribution, wrinkles may be produced on the membrane, and image quality is thus degraded at the region exhibiting wrinkles, such as a peripheral edge in an image.

To address the above-mentioned issue, one embodiment of the present disclosure provides an image module with an auto-focusing device, in which a modified membrane has a first region and a second region surrounding the first region, wherein the first region has a planar surface, and the second region has a number of corrugation structures. The corrugation structures may be formed with ring-shape and are concentrically arranged. By arranging the corrugation structures next to a cantilever beam which is used to support the membrane and used to change a curvature of the membrane, an initial stress in the membrane is greatly reduced thereby improving image device performance.

FIG. 1 is a schematic view of an image module 1, in accordance with some embodiments of the present disclosure. In some embodiments, the image module 1 includes a circuit board 2, an image sensor 3 and an auto-focusing device 10. The elements of the image module 1 can be added to or omitted, and the invention should not be limited by the embodiment.

In some embodiments, the image sensor 3 is bonded to electrical terminals in the circuit board 2, such as a printed circuit board (PCB). The image sensor 3 may be a Charge Coupled Device (CCD) image sensor. A charge coupled device (CCD) image sensor is an electronic device that is capable of transforming a light pattern or image into an electric charge pattern or electronic image. The CCD includes several photosensitive elements that have the capacity to collect, store and transport electrical charge from one photosensitive element to another. The photosensitive properties of silicon make silicon the material of choice in the design of image sensors. Each photosensitive element represents a picture element, or pixel. With semiconductor technologies and design rules, structures are made that form lines, or matrices, of pixels. One or more output amplifiers at the edge of the chip collect the signals from the CCD. An electronic image can be obtained by applying a series of pulses that transfer the charge of one pixel after another to the output amplifier, line after line. The output amplifier converts the charge into a voltage. External electronics transform the output signal into a form suitable for monitors or frame grabbers.

Alternatively, the image sensor 3 may be CMOS (Complementary Metal Oxide Semiconductor) image sensor. CMOS (complementary metal oxide semiconductor) image sensors operate at a lower voltage than CCD image sensors, reducing power consumption for portable applications. Each CMOS active pixel sensor cell has its own buffer amplifier and can be addressed and read individually. A commonly used cell has four transistors and a photo-sensing element. The cell has a transfer gate separating the photo sensor from a capacitive "floating diffusion", a reset gate between the floating diffusion and power supply, a source-follower transistor to buffer the floating diffusion from readout-line capacitance, and a row-select gate to connect the cell to the readout line. All pixels on a column connect to a common sense amplifier. In addition to their lower power consumption when compared with CCDs, CMOS image sensors are generally of a much simpler design, often having a crystal and decoupling. For this reason, they are easier to design with, generally smaller, and require less support circuitry than CCD image sensors.

The auto-focusing device 10 is positioned over the image sensor 3 and configured to change a focal point of a light L impinging the imaging module 1. In accordance with some embodiments of the present disclosure, the auto-focusing device 10 includes a foot member 11, a cantilever beam member 12, a piezoelectric member 13, a membrane 14, a frame 15, a liquid optical medium 16 and a protection layer 17.

In the following description, unless otherwise described, a width of any one of the elements presented in figures is referred to as a dimension of the element in a direction that is perpendicular to the optical axis O of the auto-focusing device 10, and a thickness or a height of any one of the elements is referred to as a dimension of the element a direction that is parallel to the optical axis O.

The foot member 11 is used to connect the auto-focusing device 10 to the circuit board 2. In some embodiments, the foot member 11 has a ring shape with a center aligning with an optical axis O of the imaging module 1. However, it should be appreciated that many variations and modifications can be made to embodiments of the disclosure. In some embodiments, the foot member 11 has a number of columns circumferentially arranged around the optical axis O of the imaging module 1. The foot member 11 may be formed with multiple layers, such as a base layer 116 and a first dielectric layer 117. Method for forming the foot member 11 will be described in detail in the embodiments related to FIGS. 6-9.

The cantilever beam member 12 is configured to support the membrane 14. In some embodiments, the cantilever beam member 12 is positioned above the foot member 11. The cantilever beam member 12 extends along a direction that is perpendicular to the optical axis O of the imaging module 1 from an outer edge 111 to an inner edge 112. In some embodiments, the cantilever beam member 12 has a greater width than that of the foot member 11 in the direction that is perpendicular to the optical axis O of the imaging module 1. Specifically, as shown in FIG. 1, the outer edge 121 of the cantilever beam member 12 is flush with an outer edge 111 of the foot member 11. The inner edge 122 of the cantilever beam member 12 is located closer to the optical axis O of the imaging module 1 than an inner edge 112 of the foot member 11. As a result, an interference between the foot member 11 and the cantilever beam member 12 can be prevented during the movement of the cantilever beam member 12.

In some embodiments, the cantilever beam member 12 has a ring shape with a center aligning with an optical axis O of the imaging module 1. An aperture 120 is surrounded by the inner edge 122 of the cantilever beam member 12. The aperture 120 may have a width W0 that is in a range from about 1500 um to about 3000 um. The aperture 120 allows light impinging the auto-focusing device 10 passing through and being projected on the image sensor 3. The cantilever beam member 12 may be formed with multiple layers, such as a supporting layer 126 and a second dielectric layer 127. Method for forming the cantilever beam member 12 will be described in detail in the embodiments related to FIGS. 6-9.

The piezoelectric member 13 is configured to bend the cantilever beam member 12 to control a curvature of the membrane 14 connected to the cantilever beam member 12 by applying electrical charge. In some embodiments, the piezoelectric member 13 is distant from the inner edge 122 of the cantilever beam member 12 to allow a bending of the cantilever beam member 12. Specifically, the piezoelectric member 13 covers an outer portion 123 of the cantilever beam member 12 that is immediately connected to the outer edge 121 of the cantilever beam member 12, and an inner portion 124 of the cantilever beam member 12 that is immediately connected to the inner edge 122 of the cantilever beam member 12 is exposed by the piezoelectric member 13.

In some embodiments, the piezoelectric member 13 includes multiple stacked layers. For example, the piezoelectric member 13 includes a first metal electrode layer 136, a piezoelectric material layer 137 and a second metal electrode layer 138. The first metal electrode layer 136, the piezoelectric material layer 137 and the second metal electrode layer 138 are sequentially stacked on the cantilever beam member 12, with the first metal electrode layer 136 being in contact with the second dielectric layer 127 of the cantilever beam member 12. In some embodiments, the piezoelectric material layer 137 includes material, such as barium titanate or lead zirconate titanate (PZT) ceramic, that demonstrates a piezoelectric effect while the application of an electrical field.

Figure 2:
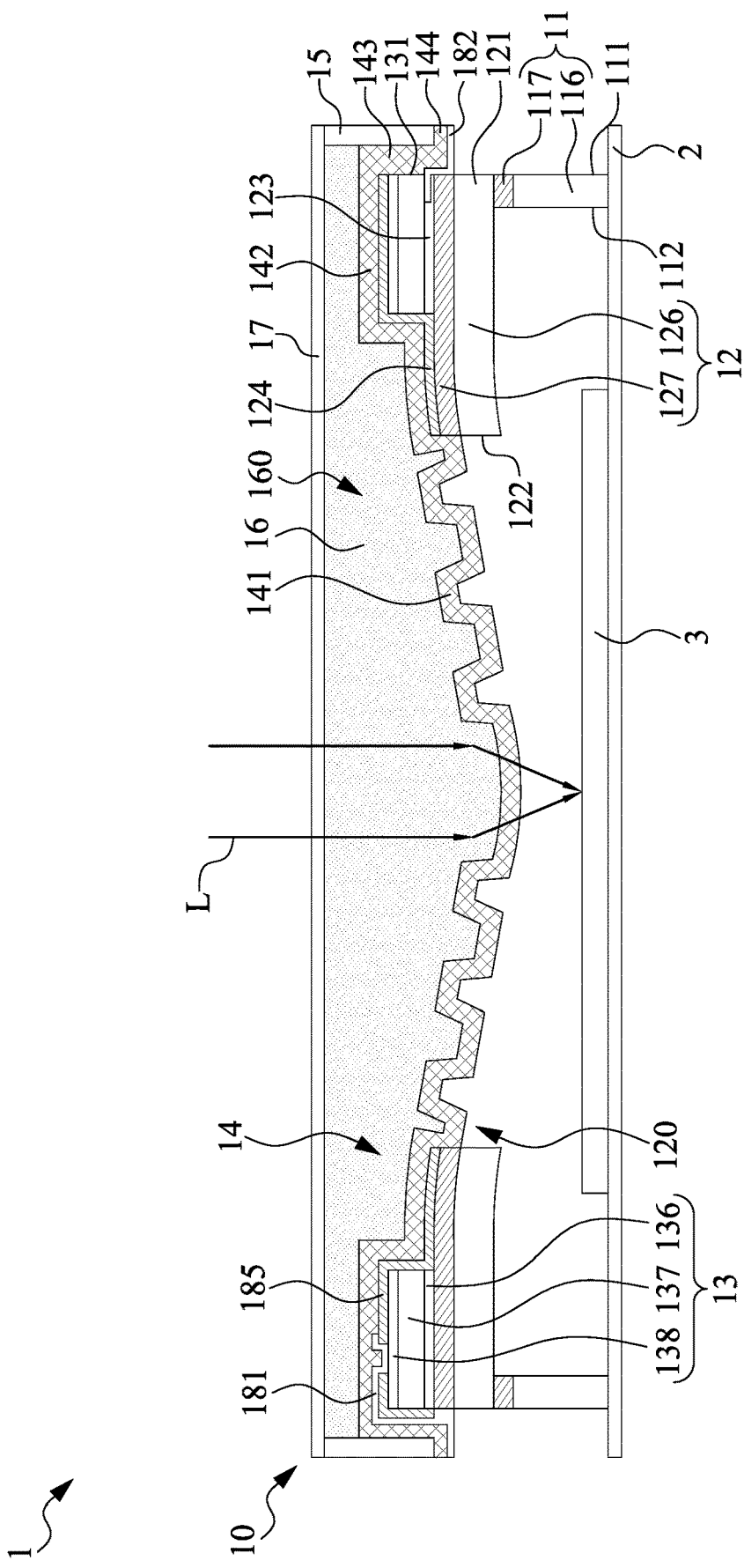
FIG. 2 is a cross-sectional view of an imaging module, in which a membrane for controlling focal point is in a curved state, in accordance with some embodiments of the present disclosure.

In some embodiments, two traces 181 and 182 are respectively electrically connected to the first metal electrode layer 136 and the second metal electrode layer 138. In operation, electrical charges are applied to the first metal electrode layer 136 and the second metal electrode layer 138 through traces 181 and 182, and an internal mechanical strain is generated in the piezoelectric material layer 137 in response to an applied electrical field produced between the first metal electrode layer 136 and the second metal electrode layer 138. As a result, as shown in FIG. 2, the cantilever beam member 12 which is directly in contact with the piezoelectric member 13 is bent, and the curvature of the membrane 14 is changed, which leads the light L impinging the auto-focusing device 10 to be correctly focused on the image sensor 3.

In some embodiments, the first metal electrode layer 136 constitutes an address electrode to which a variable voltage is applied, and the second metal electrode layer 138 constitutes a ground electrode to which a fixed voltage is applied. However, it should be appreciated that many variations and modifications can be made to embodiments of the disclosure. The first metal electrode layer 136 and the second metal electrode layer 138 can be connected to two different electric sources with varied electrical voltages.

In some embodiments, the auto-focusing device 10 further includes a passivation layer 185 formed over the cantilever beam member 12 and the piezoelectric member 13. The passivation layer 185 provides passivation for the piezoelectric member 13 and mainly helps in reducing a leakage path from the piezoelectric member 13 to the other elements. The passivation layer 185 may comprises $Al_2O_3$, silicon nitride material or silicon oxide material.

Referring FIG. 1, the membrane 14 is configured to control a shape of the liquid optical medium 16 that is stored in a space 160. For purpose of illustration, the membrane 14 in the embodiment shown in FIG. 1, is divided into a central portion 141, a peripheral portion 142 and an edge portion 143. The central portion 141, the peripheral portion 142 and the edge portion 143 are radially arranged along the direction that is perpendicular to the optical axis O of the auto-focusing device 10.

In some embodiments, the membrane 14 extends across the auto-focusing device 10 and covers the aperture 120 defined by the cantilever beam member 12. That is, as shown in FIG. 1, the central portion 141 is located within the aperture 120 and surrounded by the inner edge 122 of the cantilever beam member 12. The peripheral portion 142 surrounds the central portion 141 and covers the inner portion 124 of the cantilever beam member 12 and the piezoelectric member 13. The edge portion 143 surrounds the peripheral portion 142 and covers an outer edge 131 of the piezoelectric member 13. The outer edge 131 of the piezoelectric member 13 may be flush with the outer edge 121 of the cantilever beam member 12. In the cases where the passivation layer 185 is formed over the cantilever beam member 12 and the piezoelectric member 13, the passivation layer 185 is located underlying the peripheral portion 142 and the edge portion 143 of the membrane 14.

In some embodiments, the membrane 14 further includes a flange 144. The flange 144 surrounds the edge portion 143 for supporting the frame 15 and extends in the direction that is perpendicular to the optical axis O of the auto-focusing device 10. However, it should be appreciated that many variations and modifications can be made to embodiments of the disclosure. In some other embodiments, the flange 144 is omitted, and the frame 15 is supported by other structure, such as the foot member 11 or the cantilever beam member 12. The membrane 14 may be made of material including low stress silicon nitride or silicone and has a thickness that is in a range from 1 um to about 5 um.

In accordance with some embodiments, structural features of the central portion 141 of the membrane 14 are described below.

Figure 3:
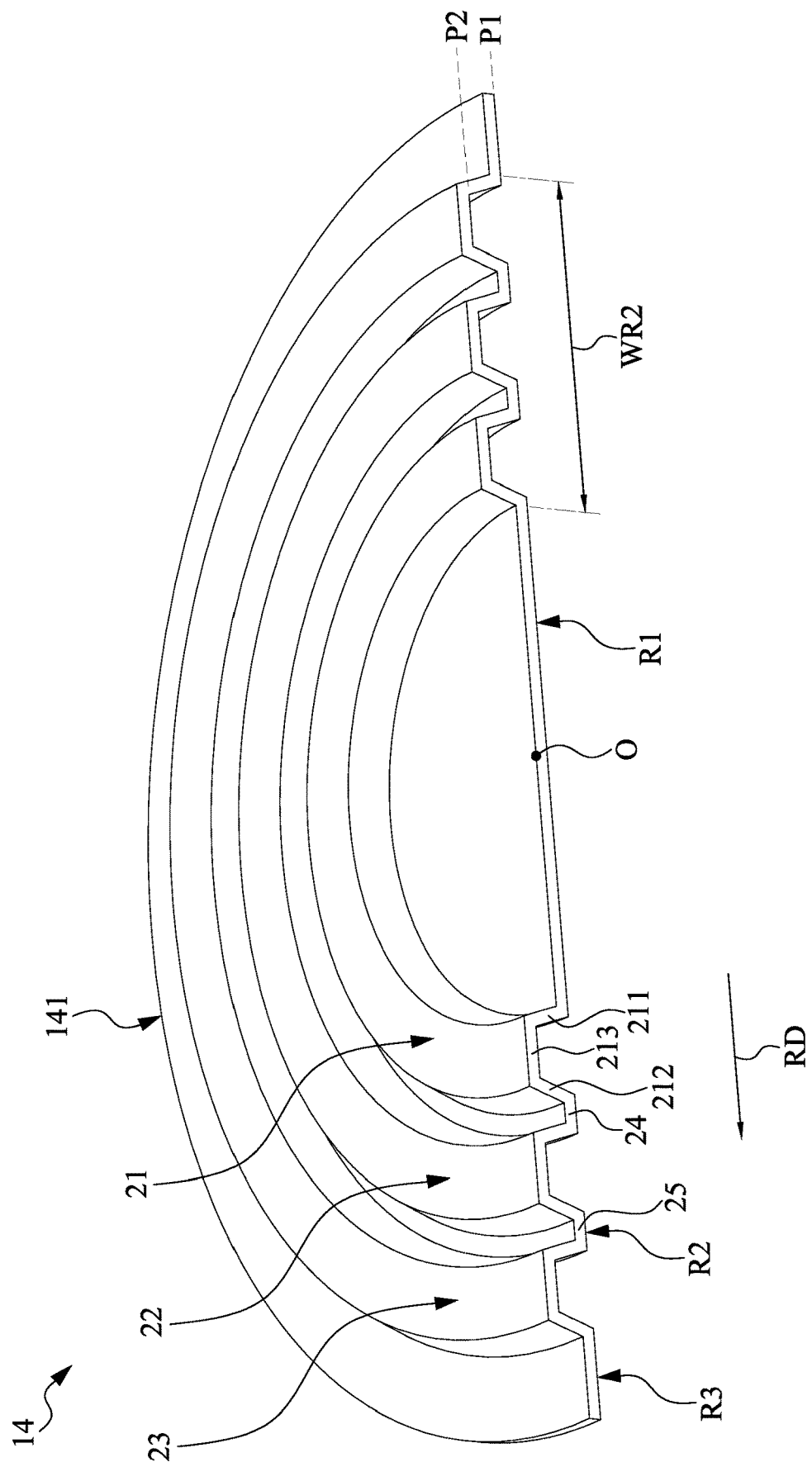
FIG. 3 is a perspective cross-sectional view of a membrane, in accordance with some embodiments of the present disclosure.
Figure 4:
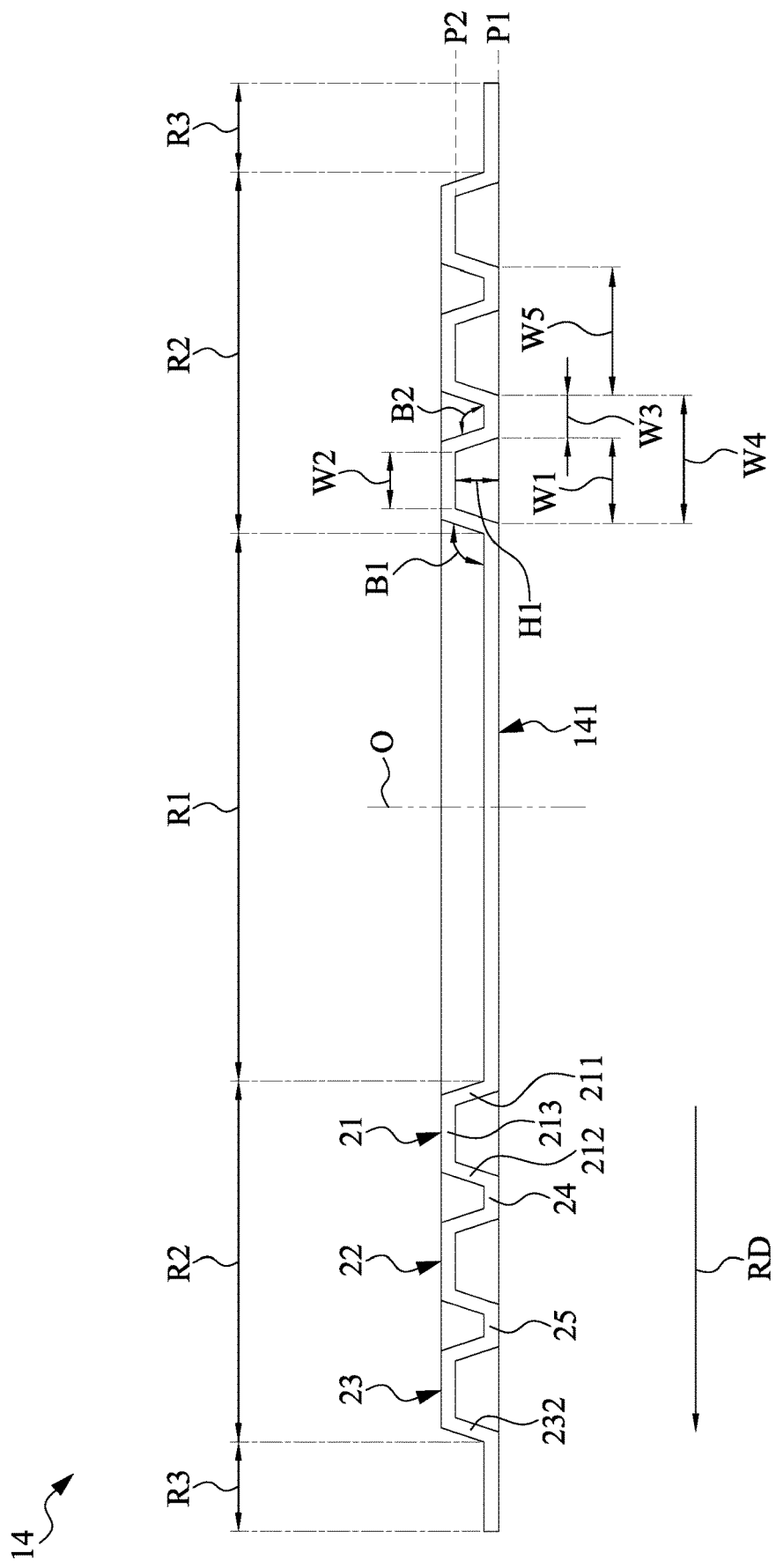
FIG. 4 is a cross-sectional view of a membrane, in accordance with some embodiments of the present disclosure.

FIG. 3 is a perspective cross-sectional view of the central portion 141 of the membrane 14, in accordance with some embodiments of the present disclosure. FIG. 4 is a cross-sectional view of the central portion 141 of the membrane 14, in accordance with some embodiments of the present disclosure. For the purpose of illustration, as shown in FIGS. 3 and 4, the central portion 141 of the membrane 14 is divided into three regions, i.e., first region R1, second region R2 and third region R3. The first region R1, the second region R2 and the third region R3 are consecutively arranged in the radial direction RD of the membrane 14. It will be noted that, in the embodiments shown in FIGS. 3 and 4, the first region R1, the second region R2 and the third region R3 are integrally formed and no gap is formed between them.

In some embodiments, the first region R1 has a round shape and corresponds to the optical axis O of the auto-focusing device 10. The second region R2 surrounds the first region R1 and has a ring shape. As seen from a top view, the second region R2 has a width WR2 that is in a range from about 30 um to about 300 um. In some embodiments, the first religion R1 has a diameter that is in a range from about 1000 um to about 2950 um.

The first region R1 has a substantially smooth and planar surface and extends in a first plane P1 at which the supporting layer 126 meets with the second dielectric layer 127 (FIG. 1). The second region R2 includes a number of corrugation structures, such as corrugation structure 21, corrugation structure 22 and corrugation structure 23. Each of the corrugation structure 21, the corrugation structure 22 and the corrugation structure 23 is formed with a ring shape, and concentrically arranged relative to the optical axis O of the auto-focusing device 10 (FIG. 1).

In some embodiments, each of the corrugation structure 21, the corrugation structure 22 and the corrugation structure 23 has a tapered cross section. For example, the corrugation structure 21 has a first side wall 211, a second side wall 212 and a top wall 213. The first side wall 211 is connected to the first region R1 and inclined relative to the first plane P1 by an angle B1 (FIG. 4). The second side wall 212 is located opposite to the first side wall 211 and inclined relative to the first plane P1 by the same angle B2. The top wall 213 connects top ends of the first side wall 211 and the second side wall 212. The top wall 213 extends on a second plane P2 that is parallel to the first plane P1. The bottom of the corrugation structure 21 has a width W1, and the top of the corrugation structure 21 has a width W2. The width W1 is greater than width W2.

In one embodiment, the width W2 is in a range from about 1 um to about 30 um. The corrugation structure 21 may have a form of a symmetrical trapezium. That is, the angle B1 is equal to the angle B2. The angles B1 and B2 may be in a range from about 95 degrees to about 150 degrees. The corrugation structure 22 and the corrugation structure 23 may have similar or the same configuration as the corrugation structure 21 and will not repeated herein.

It will be appreciated that while in the embodiment shown in FIGS. 3 and 4, the corrugation structure 21, the corrugation structure 22 and the corrugation structure 23 has a trapezium at its cross section, the disclosure should not be limited thereto. The corrugation structure 21, the corrugation structure 22 and the corrugation structure 23 may be formed with any shape, such as rectangular, semi-circular, triangular, or a combination thereof.

In some embodiments, a connection structure, is formed between two of the corrugation structure 21, the corrugation structure 22 and the corrugation structure 23 positioned adjacent to each other. For example, a connection structure 24 is formed between the corrugation structure 21 and the corrugation structure 22, and a connection structure 25 is formed between the corrugation structure 22 and the corrugation structure 23. Each of the connection structure 24 and the connection structure 25 has a ring shape and formed concentrically relative to the optical axis O. The connection structure 24 and the connection structure 25 extend on the first plane P1. In some embodiments, each of the connection structure 24 and the connection structure 25 has a width W3 that is in a range from about 1 um to about 30 um. The width W3 may be less than the width W2. In some embodiments, the connection structures 24 and 25 are omitted. The corrugation structure 21, the corrugation structure 22 and the corrugation structure 23 are immediately adjacent to each other.

In some embodiments, two of the corrugation structure 21, the corrugation structure 22 and the corrugation structure 23 positioned adjacent to each other are spaced by the same pitch. For example, the corrugation structure 21 and the corrugation structure 22 are spaced by a distance W4, and the corrugation structure 22 and the corrugation structure 23 are spaced by a distance W5. The distance W4 is identical to the distance W5. However, it should be appreciated that many variations and modifications can be made to embodiments of the disclosure. The pitch between two corrugation structures positioned adjacent to each other may be varied.

In some embodiments, in the radial direction RD of the membrane 14 away from the optical axis O, the density and the size of the corrugation structures gradually increase. In the other words, in the radial direction RD away from the optical axis O, a pitch of two neighboring corrugation structures gradually increases, and a height or a width the corrugation structure gradually increases as well. For example, the corrugation structure 21, the corrugation structure 22 and the corrugation structure 23 are sequentially arranged along in a radial direction away from the optical axis O. The distance between the corrugation structure 22 and the corrugation structure 23 is greater than the distance between the corrugation structure 22 and the corrugation structure 21. In addition, a height of the corrugation structure 23 may be greater than a height of the corrugation structure 22, and the height of the corrugation structure 22 may be greater than a height of corrugation structure 21. In some embodiment, since an initial stress in the membrane 14 gradually increases in the radial direction RD away from the membrane 14 away from the optical axis O, by arranging the corrugation structures with varied densities and sizes, the initial stress can be adequately released, and the area ratio of the first region R1 can be maximized in the same time. Therefore, the image quality is greatly improved.

In some embodiments, a side wall of an innermost corrugation structure overlaps with a boundary of the first region R1 and the second region R2, and a side wall of an outermost corrugation structure overlaps with a boundary of the second region R2 and the third region R3. For example, as shown in FIG. 4, the corrugation structure 21 is the innermost corrugation structure (i.e., nearest to the optical axis O), and the first side wall 211 overlaps with a boundary of the first region R1 and the second region R2. In addition, the corrugation structure 23 is the outermost corrugation structure (i.e., farthest away from the optical axis O), and a side wall 232 thereof overlaps a boundary of the second region R2 and the third region R3.

Figure 5:
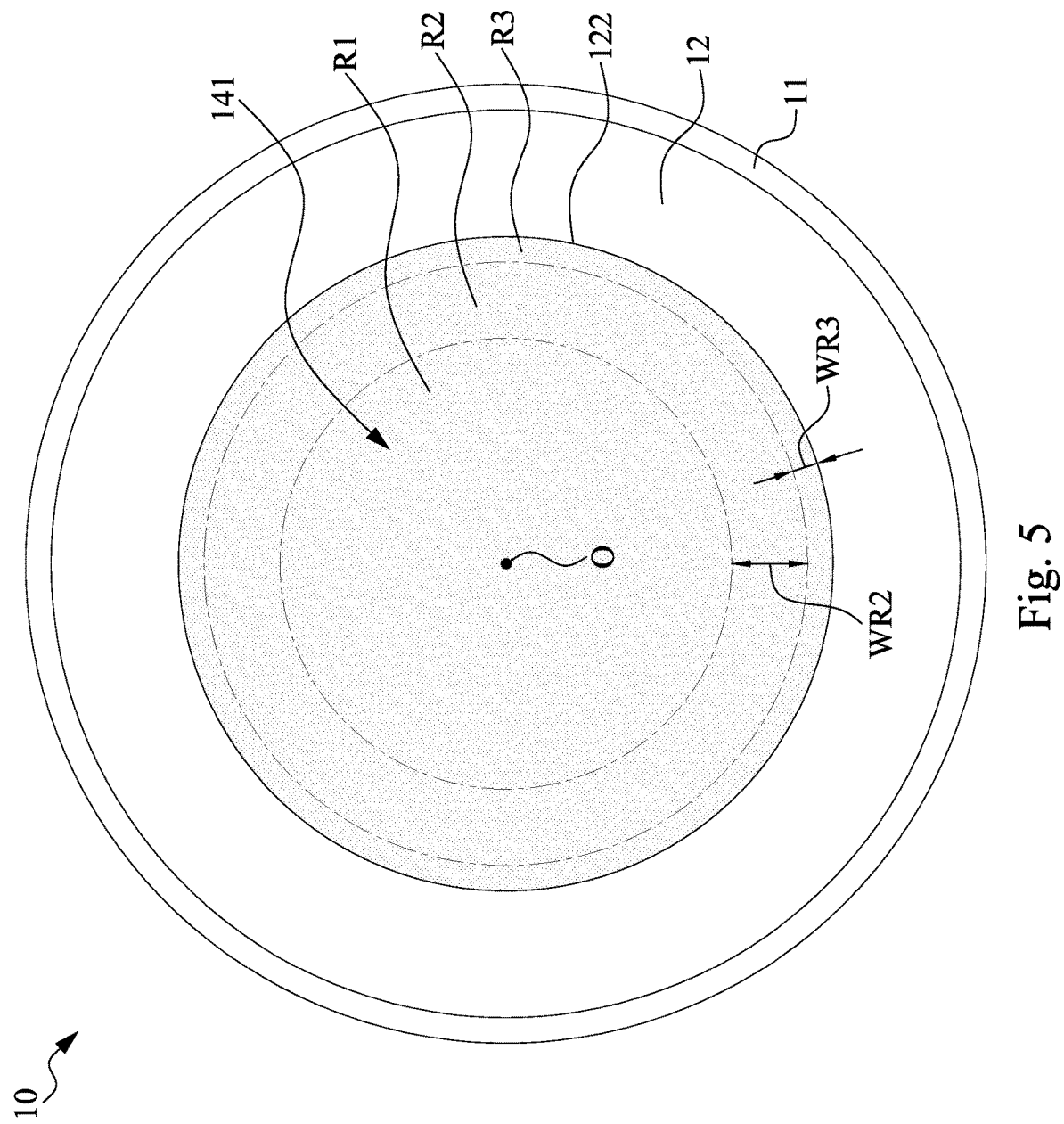
FIG. 5 is a bottom view of a cantilever beam and a membrane, in accordance with some embodiments of the present disclosure.

The third region R3 surrounds the second region R2. In some embodiments, the third region R3 has a substantially planar surface extending in a first plane P1 and is free of corrugation structure. In some embodiments, as shown in FIG. 5, the third region R3 is adjacent to the inner edge 122 of the cantilever beam member 12 and is located between the inner edge 122 of the cantilever beam member 12 and the second region R2. The width WR3 of the third region R3 is greater than 20 and less than 200 um. In some embodiments, the third region R3 is omitted, the second region R2 is adjacent to the inner edge 122 of the cantilever beam member 12 (i.e., the width WR3 of the third region R3 is equal to 0).

Although FIGS. 3 and 4 illustrates three corrugation structures (e.g., corrugation structure 21, corrugation structure 22 and corrugation structure 23) formed in the membrane 14, the membrane 14 can include any number of corrugation structures to release the initial stress. In some embodiments, the number of the corrugation structures in the membrane 14 is in a range from 1 to 10.

Referring to FIG. 1 again, the frame 15 is configured to support the protection layer 17. In some embodiments, as shown in FIG. 1, the frame 15 is positioned at an outer side (i.e., a side that is away from the optical axis O of the auto-focusing device 10) of the piezoelectric member 13 and positioned on the flange 144 of the membrane 14. In some embodiments, a portion of the membrane 14 is sandwiched between the frame 15 and the piezoelectric member 13. The frame 15 may be made of material including SiN and has a width that is in a range from about 50 um to about 100 um. In some embodiments, the frame 15 is located at outermost edge of the auto-focusing device 10, and the frame 15 has a ring shape and has an outer diameter that is in a range from about 2000 um to about 4500 um.

The protection layer 17 is positioned above the frame 15. In some embodiments, a space 160 for storing liquid optical medium is surrounded by the membrane 14, the frame 15 and the protection layer 17. The protection layer 17 is made of light-permeable material, such as glass. In some embodiments, the protection layer 17 has a thickness that is in a range from about 200 um to about 300 um. In some embodiments, the protection layer 17 has a thickness of 200 um.

Figure 6:
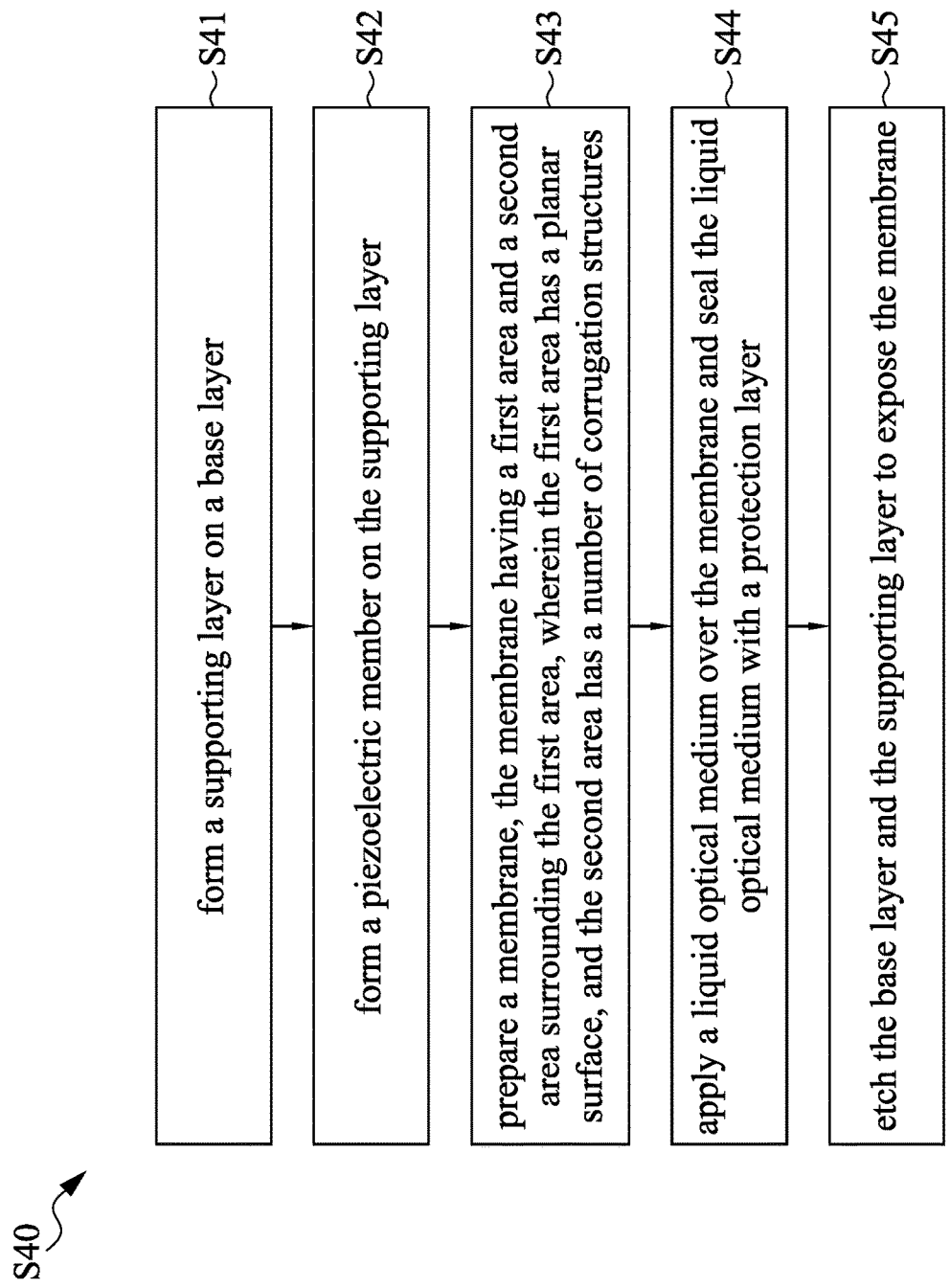
FIG. 6 is a flow chart of a method for fabricating an auto-focusing device, in accordance with some embodiments of the present disclosure.

FIG. 6 is a flow chart of a method S40 for fabricating an auto-focusing device, in accordance with some embodiments of the present disclosure. Although the method S40 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that other figures are used as examples for the method, but the method is also applicable to other structures and/or configurations.

Figure 7:
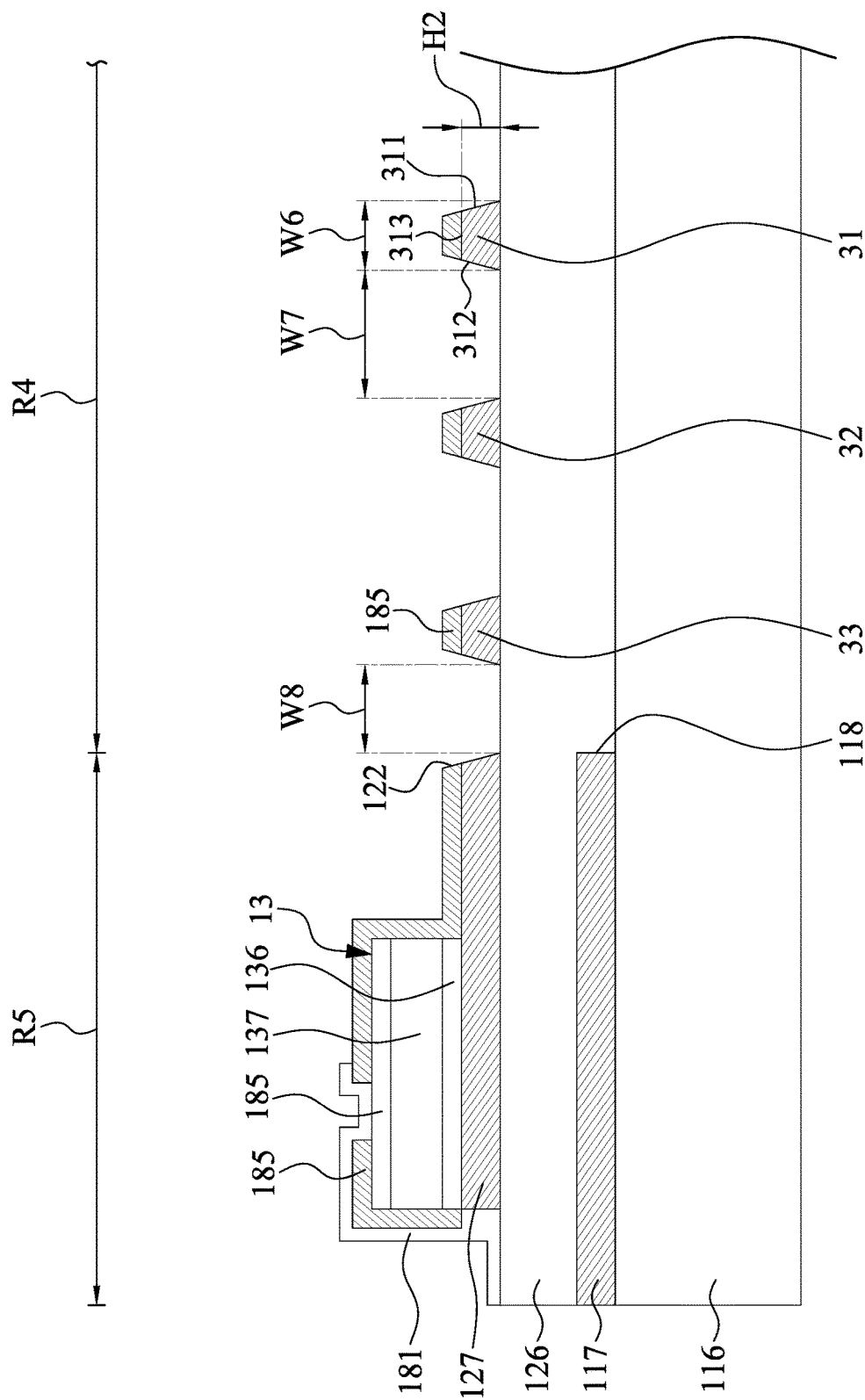
FIG. 7 is a cross-sectional view of a stage of a method for fabricating an auto-focusing device in which a piezoelectric member is positioned on a supporting layer, in accordance with some embodiments.

The method S40 includes operation S41, in which the supporting layer 126 is formed over the base layer 116. The base layer 116 may be a bulk silicon substrate, a germanium substrate, a compound semiconductor substrate, or other suitable substrate. In some embodiments, as shown in FIG. 7, before the formation of the supporting layer 126, the first dielectric layer 117 can be formed over the base layer 116. The first dielectric layer 117 may be deposited over the entire supporting layer 126 using suitable deposition techniques, such as atomic layer deposition (ALD), chemical vapor deposition (CVD), physical vapor deposition (PVD) or the like. The first dielectric layer 117 is then patterned to expose a portion of the base layer 116 using suitable photolithography and etching techniques. The removed area of the first dielectric layer 117 can be determined based on the shape and the area of the aperture 120 shown in FIG. 1.

The supporting layer 126 may be deposited over the exposed supporting layer 126 and the first dielectric layer 117 using suitable deposition techniques, such as atomic layer deposition (ALD), chemical vapor deposition (CVD), physical vapor deposition (PVD) or the like. A chemical mechanical polish (CMP) process may be optionally performed on the deposited supporting layer 126, so that the resulting supporting layer 126 can have a substantially planar top surface. The first dielectric layer 117 may be formed of a dielectric material, such as an oxide layer, and the supporting layer 126 may be formed of a different dielectric material than the first dielectric layer 117, such as polysilicon or other suitable materials. In some embodiments, the supporting layer 126 is thicker than the first dielectric layer 117. For example, the supporting layer has a thickness that is in a range from about 3 um to about 10 um, and the first dielectric layer 117 has a thickness that is in a range from about 0.1 um to about 1 um.

In some embodiments, as shown in FIG. 7, the supporting layer 126 has a central region R4 and a peripheral region R5. The central region R4 has a round shape which is corresponds to the apertures 120 which will formed in the following process. The peripheral region R5 surrounds the central region R4. In some embodiments, the boundary of the central region R4 and the peripheral region R5 overlaps an inner end 118 of the first dielectric layer 117 which defines the width of the apertures 120 in the following etching process.

In some embodiments, as shown in FIG. 7, after the formation of the supporting layer 126, a second dielectric layer 127 is formed overlying the supporting layer 126 using suitable deposition techniques, such as atomic layer deposition (ALD), chemical vapor deposition (CVD), physical vapor deposition (PVD) or the like, followed by an etching process to pattern the second dielectric layer 127 to form projections 31, 32 and 33. The second dielectric layer 127 may be formed of the same dielectric material as that of the first dielectric layer 117. The thickness of the second dielectric layer 127 may be in a range from about 1 um to about 2 um. In the cases where the membrane 14 is fabricated by molding, the second dielectric layer 127 may be omitted.

The method S40 also includes operation S42, in which a piezoelectric member 13 is formed on the supporting layer 126 relative to the peripheral region R5 of the supporting layer 12. In some embodiments, to form the piezoelectric member 13, the first metal electrode layer 136, the piezoelectric material layer 137 and the second metal electrode layer 138 are sequentially stacked on the supporting layer 126 (or the second dielectric layer 127). The first metal electrode layer 136, the piezoelectric material layer 137 and the second metal electrode layer 138 are then patterned to expose the inner portion 124 of the supporting layer 126 using suitable photolithography techniques. In some embodiments, the first metal electrode layer 136 and the second metal electrode layer 138 are made of conductive metal such as, Pt and each has a thickness that is in a range from about 0.1 um to about 0.5 um. The piezoelectric material layer 137 may be made material, such as barium titanate or lead zirconate titanate (PZT) ceramic and has a thickness that is in a range from about 0.3 um to about 1 um.

In some embodiments, after the formation of the piezoelectric material layer 137, a passivation layer 185 is deposited over the piezoelectric member 13 and the supporting layer 126 (or the second dielectric layer 127) using suitable deposition techniques, such as atomic layer deposition (ALD), chemical vapor deposition (CVD), physical vapor deposition (PVD) or the like. The passivation layer 185 may be patterned to formed a via for facilitating electrical connection between the trace 181 and the piezoelectric member 13. The passivation layer 185 may be made of material including SiN and has a thickness of about 0.1 um to about 0.5 um. The trace 181 may be made of metal including Ti, Au or other suitable conductive material and has a thickness of about 0.1 um to about 1 um.

The method S40 also includes operation S43, in which the membrane 14 as described in FIGS. 3 and 4 is prepared. In according with some embodiments, as shown in FIG. 7, the preparing of the membrane 14 includes patterning the second dielectric layer 127 to form a number of projections, such as first projection 31, second projection 32 and third projection 33 on the central region R4 of the supporting layer 126.

The first projection 31, the second projection 32 and the third projection 33 may be respectively formed with a shape corresponding to the corrugation structure 21, the corrugation structure 22 and the corrugation structure 23. In some embodiments, each of the first projection 31, the second projection 32 and the third projection 33 is formed with a ring shape, as seen from a top view, and concentrically arranged. In addition, each of the first projection 31, the second projection 32 and the third projection 33 is tapered away from the supporting layer 126. For example, as shown in FIG. 7, the first projection 31 includes a first side wall 311, a second side wall 312 and a top surface 313. The first side wall 311 is inclined relative to the supporting layer 126, and the second side wall 312 is inclined relative to the supporting layer 126. The top surface 313 connects the first side wall 311 to the second side wall 312. The top surface 313 is parallel to the supporting layer 126.

In some embodiments, each of the first projection 31, the second projection 32 and the third projection 33 has an identical width W6, and two neighboring features, such as first projection 31 and second projection 32, are spaced apart by a distance W7. The distance W7 may be greater than the width W6. In some embodiments, each of the first projection 31, the second projection 32 and the third projection 33 has a height H2 of about 2 um to about 15 um. The height H2 may be slightly less than the height H1 (see FIG. 4) of the following fabricated corrugated structure in cases where the passivation layer 185 is formed on the features 31-33.

In some embodiments, the outermost feature, such as the third projection 33 is distant away from the inner edge 122 of the cantilever beam member 12 by a predetermined distance W8. In some embodiments, the predetermined distance W8 is greater than 0. For example, the predetermined distance W8 is in a range from about 18 um to about 100 um (i.e., difference between the width WR3 and the thickness of the membrane 14). In some other embodiments, the third projection 33 is immediately adjacent to the inner edge 122 of the cantilever beam member 12, and no gap is formed between a bottom edge of the third projection 33 and the inner edge 122 of the cantilever beam member 12.

Figure 8:
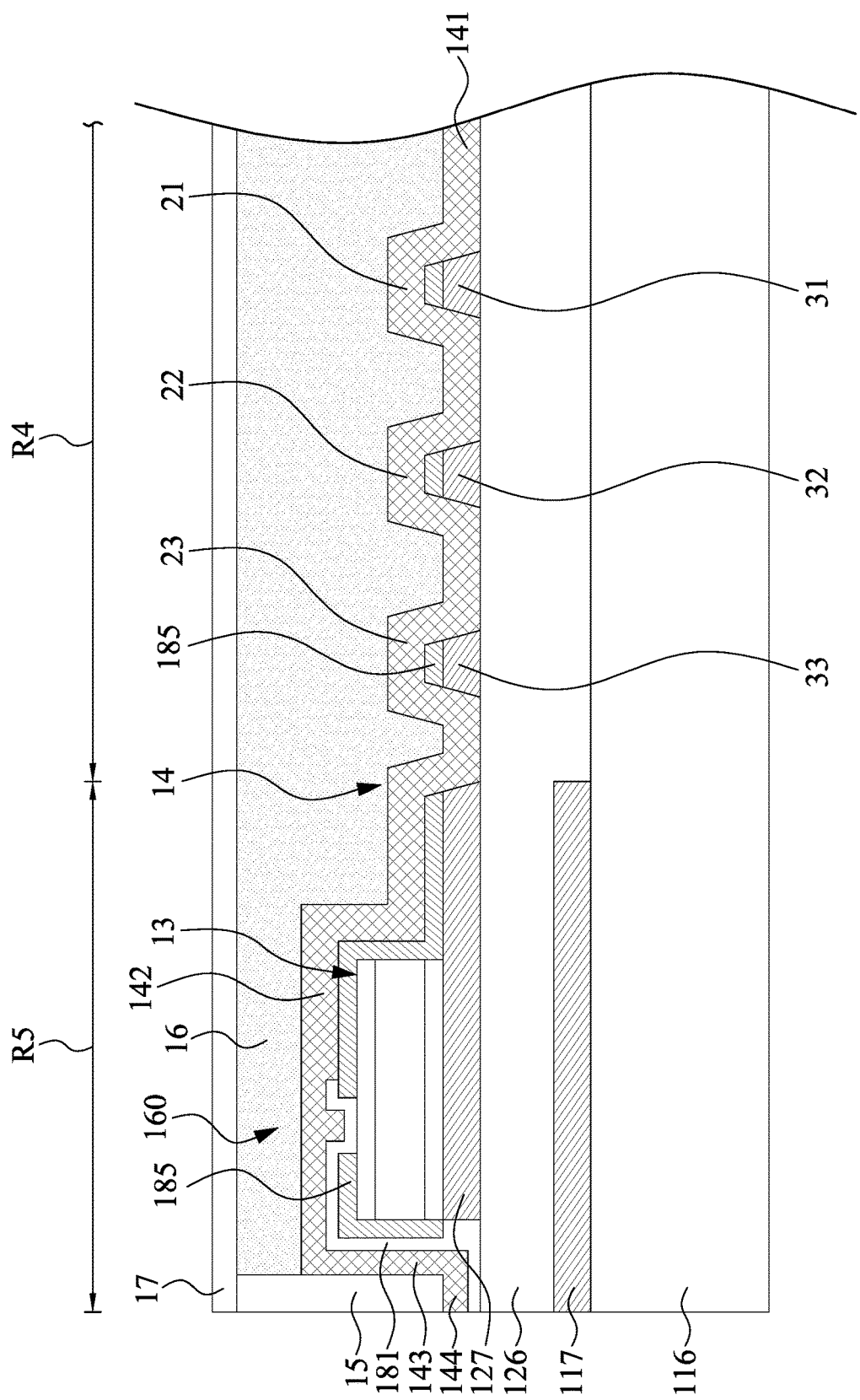
FIG. 8 is a cross-sectional view of a stage of a method for fabricating an auto-focusing device in which a membrane, a liquid optical medium and a protection layer are positioned over a supporting layer, in accordance with some embodiments.

As shown in FIG. 8, the preparing of the membrane 14 also includes forming a polymer layer over the piezoelectric member 13 and the second dielectric layer 127 which has been patterned using suitable deposition techniques, such as atomic layer deposition (ALD), chemical vapor deposition (CVD), physical vapor deposition (PVD) or the like. The polymer layer may have a thickness that is in a range from about 1 um to about 5 um. The membrane 14 may be conformally formed over the first projection 31, the second projection 32 and the third projection 33.

It will be noted that the preparing of the membrane 14 is not limited to the above mentioned embodiment. In another embodiment, a patterned mold (not shown in figures) having a number of features corresponding to the corrugation structure 21 is used to press a membrane 14. After pressing the membrane, the patterned mold is removed from the membrane, and the membrane maintains the opposite shape of the features of the patterned mold. The membrane 14 is then placed on the cantilever beam member 12.

The method S40 also includes operation S44, in which the liquid optical medium 16 is applied over the membrane 14, and the liquid optical medium 16 is sealed by the protection layer 17. In some embodiments, before the filling of the liquid optical medium 16, the frame 15 is connected to the membrane 14 in advance. The liquid optical medium 16 is applied to the space 160 defined by the frame 15 and the membrane 14. After the filling of the liquid optical medium 16, the protection layer 17 covers the top of the space 160. The protection layer 17 may be attached to the frame 15 by suitable techniques, such as curing, to seal the liquid optical medium 16 in the space 160.

Figure 9:
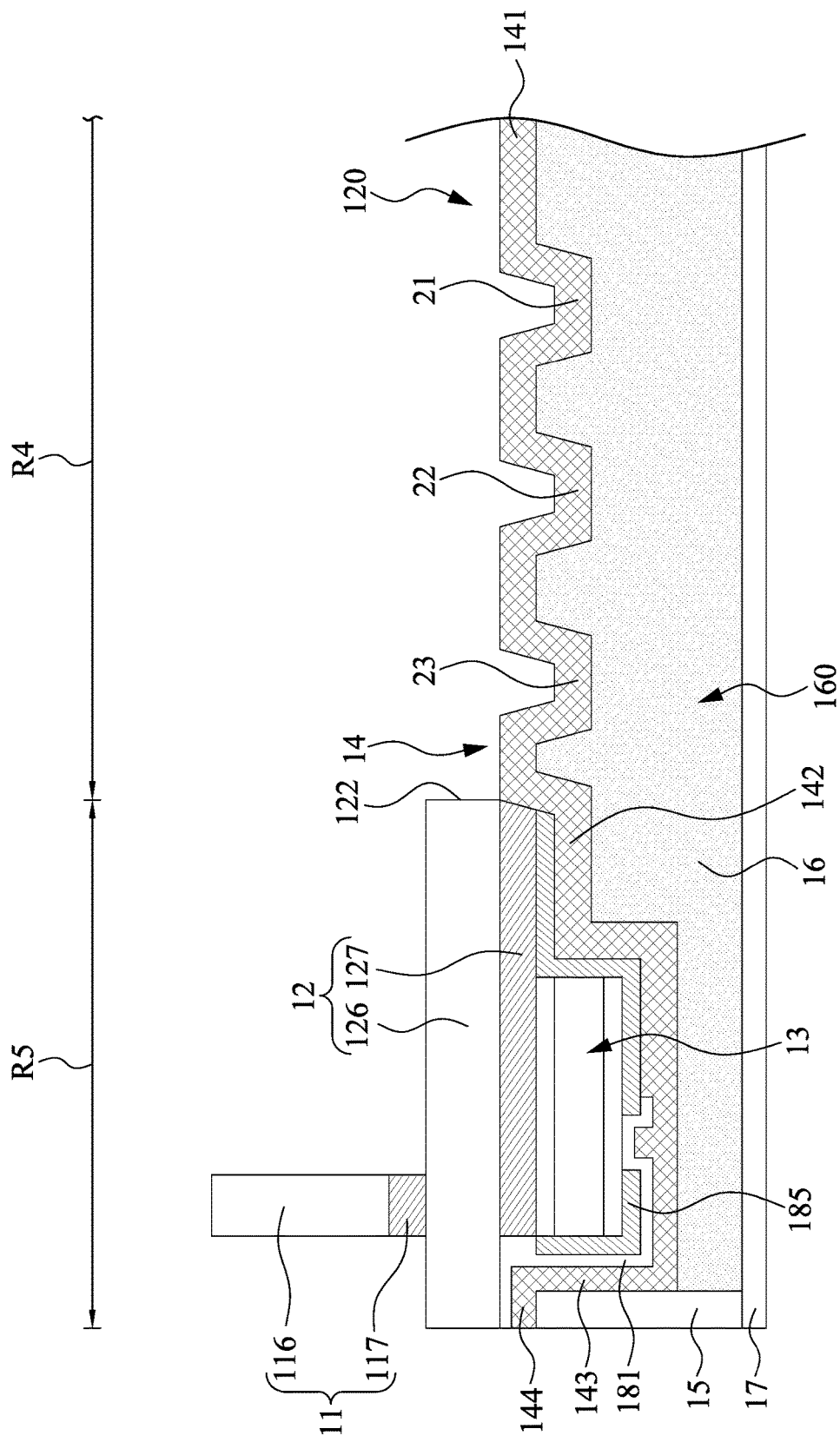
FIG. 9 is a cross-sectional view of a stage of a method for fabricating an auto-focusing device in which a supporting layer and a base layer are etched to expose a membrane, in accordance with some embodiments.

The method S40 also includes operation S45, in which the base layer 116 and the supporting layer 126 are etched to expose the membrane 14. In some embodiments, a portion of the base layer 116 and the supporting layer 126 are removed using one or more etching processes including, for example, wet etching, dry etching, or a combination of wet etching and dry etching. The resultant structure is shown in FIG. 9. The removal of a portion of the supporting layer 126 results in the aperture 120. In some embodiments, the aperture 120 has a width in a range from about 1500 um to about 3000 um. After operation S45, the cantilever beam member 12 and the central portion 141 of the membrane 14 are released. As a result, curvature of the central portion 141 of the membrane 14 can be adjusted by a strain in the piezoelectric member 13.

Based on the above discussions, it can be seen that the present disclosure offers following advantages. It is understood, however, that other embodiments may offer additional advantages, and not all advantages are necessarily disclosed herein, and that no particular advantage is required for all embodiments.

Embodiments of the present disclosure provide an auto-focusing device using a membrane having a number of corrugation structures to change a focal length of the auto-focusing device. With the corrugation structures, initial stress in the membrane is effectively released, and thus a concern of an image degradation resulting from wrinkles formed on the membrane is mitigated. Since the membrane has a smoother surface in comparison with a membrane without corrugation structures, a device performance of the image module using the auto-focusing device is significantly improved.

In accordance with some embodiments, a method of forming an auto-focusing device is provided. The method includes forming a cantilever beam member. The cantilever beam member has a ring shape. The method further includes forming a piezoelectric member over the cantilever beam member. The method also includes forming a membrane over the cantilever beam member. The membrane has a first region and a second region. The first region has a planar surface, and the second region is located between the first region and an inner edge of the cantilever beam member and has a plurality of corrugation structures. In addition, the method includes applying a liquid optical medium over the membrane and sealing the liquid optical medium with a protection layer. In some embodiments, forming the membrane is performed such that the corrugation structures are each formed with a ring shape and the corrugation structures are concentrically arranged with an optical axis of the auto-focusing device. In some embodiments, forming the membrane is performed such that the corrugation structures are spaced apart by a distance that is less than a width of each of the corrugation structures. In some embodiments, covering the cantilever beam member with the membrane is performed such that a third area of the membrane, which surrounds the second region and is formed with a planar surface, is located between the second region and the inner edge of the cantilever beam member. In some embodiments, forming the membrane is performed such that each of the corrugation structures is formed with: a first side wall inclined relative to a first plane along which the first region extends; a second side wall opposite to the first side wall and inclined relative to the first plane; and a top surface connecting the first side wall to the second side wall and being parallel to the first plane. In some embodiments, forming the membrane is performed such that each of the corrugation structures is formed with a tapered shape. In some embodiments, forming the membrane is performed such that the second region has a width that is in a range from about 50 um to about 300 um. In some embodiments, forming the piezoelectric member is performed such that a portion of the cantilever beam member next to the inner edge of the cantilever beam member is not overlapped by the piezoelectric member. In some embodiments, the method further includes before covering the cantilever beam member with the membrane, forming a passivation layer over the piezoelectric member and the cantilever beam member.

In accordance with some embodiments, a method of forming an auto-focusing device is provided. The method includes forming a supporting layer on a base layer. The supporting layer has a central region and a peripheral region surrounding the central region. The method further includes forming a dielectric layer on the supporting layer. The dielectric layer is patterned to form a first projection and a second projection in the central region of the supporting layer. The method also includes forming a piezoelectric member on the dielectric layer relative to the peripheral region of the supporting layer. In addition, the method includes covering the dielectric layer with a membrane. The membrane is conformally formed over the first projection and the second projection. Moreover, the method further includes applying a liquid optical medium over the membrane and sealing the liquid optical medium with a protection layer. The method further includes etching the base layer, the supporting layer and the dielectric layer to expose the membrane. In some embodiments, patterning the supporting layer is performed such that the first projection and the second projection are each formed with a ring shape and are concentrically arranged. In some embodiments, patterning the supporting layer is performed such that the first projection and the second projection are spaced apart by a distance that is greater than a width of each of the first projection and the second projection. In some embodiments, patterning the supporting layer is performed such that the second projection is closer to the peripheral region than the first projection, and the second projection is spaced away from a boundary of the central region and the peripheral region of the supporting layer by a predetermined distance that is greater than 0. In some embodiments, patterning the supporting layer is performed such that the first projection comprises: a first side wall inclined relative to the supporting layer; a second side wall opposite to the first side wall and inclined relative to the supporting layer; and a top surface connecting the first side wall to the second side wall and being parallel to the supporting layer. In some embodiments, patterning the supporting layer to form the first projection and the second projection is performed such that each of the first projection and the second projection is formed with a tapered shape. In some embodiments, patterning the supporting layer to form the first projection and the second projection is performed such that each of the first projection and the second projection is formed with a height of about 2 um to about 15 um. In some embodiments, forming the piezoelectric member is performed such that a portion of the supporting layer next to a boundary of the peripheral region and the central region is not overlapped by the piezoelectric member.

In accordance with some embodiments, an auto-focusing device is provided. The auto-focusing device includes a cantilever beam member with a ring shape. The auto-focusing device further includes a piezoelectric member positioned on the cantilever beam member. The auto-focusing device also includes a membrane having a first region and a second region surrounded by the cantilever beam member. The first region has a planar surface, and the second region is located between the first region and the cantilever beam member and comprises a plurality of corrugation structures. In addition, the auto-focusing device includes a protection layer and a liquid optical medium. The protection layer is positioned above the membrane, and the liquid optical medium is positioned between the membrane and the protection layer. In some embodiments, the corrugation structures are formed with a ring shape and are concentrically arranged with an optical axis of the auto-focusing device. In some embodiments, at least one of the corrugation structures has a tapered cross section. In some embodiments, the membrane further includes a third region is located between the cantilever beam member and the second region, the third region has a planar surface. In some embodiments, the second region is immediately adjacent to the cantilever beam member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a supporting layer on a base layer, wherein the supporting layer has a central region and a peripheral region surrounding the central region;
   forming a dielectric layer on the supporting layer;
   forming a piezoelectric member on the dielectric layer above the peripheral region of the supporting layer in a stacking direction;
   patterning the dielectric layer to form a first projection and a second projection in the central region of the supporting layer;
   covering the dielectric layer with a membrane, wherein the membrane is conformally formed over the first projection and the second projection;
   applying a liquid optical medium over the membrane and sealing the liquid optical medium with a protection layer; and
   etching the base layer, the supporting layer and the patterned dielectric layer to expose the membrane.

2. The method of claim 1, wherein patterning the dielectric layer is performed such that the first projection and the second projection are each formed with a ring shape and are concentrically arranged.

3. The method of claim 1, wherein patterning the dielectric layer is performed such that the first projection and the second projection are spaced apart by a distance that is greater than a width of each of the first projection and the second projection.

4. The method of claim 1, wherein patterning the dielectric layer is performed such that the second projection is closer to the peripheral region than the first projection, and the second projection is spaced away from a boundary of the central region and the peripheral region of the supporting layer by a predetermined distance that is greater than 0.

5. The method of claim 1, wherein patterning the dielectric layer is performed such that the first projection comprises:
   a first side wall inclined relative to the supporting layer;
   a second side wall opposite to the first side wall and inclined relative to the supporting layer; and
   a top surface connecting the first side wall to the second side wall and being parallel to the supporting layer.

6. The method of claim 1, wherein patterning the dielectric layer to form the first projection and the second projection is performed such that each of the first projection and the second projection is formed with a tapered shape.

7. The method of claim 1, wherein patterning the dielectric layer to form the first projection and the second projection is performed such that each of the first projection and the second projection is formed with a height of about 2 um to about 15 um.

8. A method, comprising:
   forming a supporting layer on a base layer, wherein the supporting layer has a central region and a peripheral region surrounding the central region;
   forming a dielectric layer over the supporting layer;
   forming a piezoelectric member on the dielectric layer above the peripheral region of the supporting layer in a stacking direction;

patterning the dielectric layer to form a first projection and a second projection in the central region of the supporting layer;

covering the patterned dielectric layer with a membrane, wherein a first portion of the membrane on a center of the central region of the supporting layer has a top surface lower than a top surface of a second portion of the membrane on the first projection;

applying a liquid optical medium over the membrane and sealing the liquid optical medium with a protection layer; and etching the base layer, the supporting layer, the first projection, and the second projection to expose the membrane.

9. The method of claim 8, wherein the top surface of the first portion of the membrane on the center of the central region of the supporting layer is lower than a top surface of a third portion of the membrane on the second projection.

10. The method of claim 8, wherein etching the base layer, the supporting layer, the first projection, and the second projection is such that a remaining portion of the supporting layer covers a portion of the dielectric layer on the peripheral region but exposes the second portion of the membrane.

11. The method of claim 8, wherein an interface between the liquid optical medium and the first portion of the membrane is at a height different from a height of an interface between the liquid optical medium and the second portion of the membrane.

12. The method of claim 8, wherein covering the dielectric layer with the membrane is such that the top surface of the second portion of the membrane is lower than a top surface of the piezoelectric member.

13. The method of claim 8, wherein covering the dielectric layer with the membrane is such that the membrane is in contact with a sidewall of the dielectric layer on the peripheral region.

14. The method of claim 8, wherein covering the dielectric layer with the membrane is such that a third portion of the membrane is directly between the first projection and the second projection.

15. A method, comprising:

forming a supporting layer on a base layer, wherein the supporting layer has a central region and a peripheral region surrounding the central region;

forming a dielectric layer on the supporting layer;

forming a piezoelectric member on the dielectric layer above the peripheral region of the supporting layer in a stacking direction;

patterning the dielectric layer to form a first projection and a second projection in the central region of the supporting layer;

forming a membrane to cover the piezoelectric member, the first projection and the second projection, wherein a first portion of the membrane between the first projection and the second projection has a top surface lower than a top surface of a second portion of the membrane on the first projection;

applying a liquid optical medium over the membrane and sealing the liquid optical medium with a protection layer; and etching the base layer, the supporting layer, the first projection, and the second projection to expose the membrane.

16. The method of claim 15, further comprising forming a passivation layer over the piezoelectric member, the first projection, and the second projection prior to forming the membrane.

17. The method of claim 16, further comprising forming a trace over the passivation layer and in contact with the piezoelectric member prior to forming the membrane.

18. The method of claim 15, wherein the first projection is spaced apart from a center of the central region of the supporting layer.

19. The method of claim 15, wherein the first projection and the second projection are ring-shaped in a top view.

20. The method of claim 15, wherein applying the liquid optical medium over the membrane is such that a vertical thickness of a first portion of the liquid optical medium directly above the first projection is greater than a vertical thickness of a second portion of the liquid optical medium directly above the piezoelectric member.

* * * * *